(12) United States Patent
Carpenter

(10) Patent No.: US 9,980,418 B2
(45) Date of Patent: May 22, 2018

(54) RF SHIELD ASSEMBLY

(71) Applicant: THOMSON LICENSING, Issy de Moulineaux (FR)

(72) Inventor: Joseph Lee Carpenter, Noblesville, IN (US)

(73) Assignee: Thomson Licensing (FR)

( * ) Notice: Subject to any disclaimer, the term of this patent is extended or adjusted under 35 U.S.C. 154(b) by 0 days. days.

(21) Appl. No.: 14/623,934

(22) Filed: Feb. 17, 2015

(65) Prior Publication Data
US 2015/0237769 A1 Aug. 20, 2015

Related U.S. Application Data

(60) Provisional application No. 62/067,526, filed on Oct. 23, 2014, provisional application No. 61/940,895, filed on Feb. 18, 2014.

(51) Int. Cl.
*H05K 9/00* (2006.01)
*H04N 5/64* (2006.01)

(52) U.S. Cl.
CPC .......... *H05K 9/006* (2013.01); *H05K 9/0009* (2013.01); *H05K 9/0032* (2013.01); *H04N 5/64* (2013.01); *Y10T 29/4913* (2015.01)

(58) Field of Classification Search
CPC .... H05K 9/0033; H05K 9/0009; H05K 9/006; H05K 9/0032; H04N 5/64; Y10T 29/4913
(Continued)

(56) References Cited

U.S. PATENT DOCUMENTS

| 4,069,618 A | 1/1978 | Geiss |
| 6,118,672 A | 9/2000 | Yamauchi et al. |

(Continued)

FOREIGN PATENT DOCUMENTS

| EP | 1553761 B1 | 8/2009 |
| GB | 2270206 A | 3/1994 |

(Continued)

*Primary Examiner* — Benny Lee
*Assistant Examiner* — Jorge Salazar, Jr.
(74) *Attorney, Agent, or Firm* — Jack Schwartz & Associates, PLLC

(57) ABSTRACT

An electronic device such as a set top box is provided having a vertical chassis wall having an aperture; a horizontal circuit board that extends toward the vertical chassis wall; F-connector connected to the horizontal circuit board, either under or over the board, and extending out of the a vertical chassis wall through the aperture; and inner shield, which can generally be used to contain/shield the RF circuit components mounted on the PCB, on the interior side of the vertical chassis wall and connected to the F-connector on or under the horizontal circuit board, wherein the inner shield comprises a series of vertical peripheral walls that surround components (either under or over the board); and a shield cover that covers the inner shield, the shield cover comprises a top portion that runs along or extends horizontally and side portions that extend from the periphery of the top portion and downward to overlap a part of the shield wall. The side portions contact the exterior side of the shield walls or are substantially close to the exterior side to ensure no gap therebetween or such a minimal spacing to ensure direct path for electromagnetic interference.

19 Claims, 8 Drawing Sheets

(58) Field of Classification Search
USPC .................. 333/12; 361/800, 801, 816, 818; 174/35 R; 220/4.02
See application file for complete search history.

(56) References Cited

U.S. PATENT DOCUMENTS

| | | |
|---|---|---|
| 6,377,472 B1 * | 4/2002 | Fan ..................... H05K 9/0032 |
| | | 174/379 |
| 6,949,706 B2 | 9/2005 | West |
| 7,113,061 B2 | 9/2006 | Ootori et al. |
| 2008/0158849 A1 | 7/2008 | Gallahan et al. |

FOREIGN PATENT DOCUMENTS

| | | |
|---|---|---|
| JP | 2002-010172 A | 1/2002 |
| JP | 4343829 B2 | 10/2009 |
| WO | 2011/090788 A1 | 7/2011 |

* cited by examiner

RF SHIELD ASSEMBLY

CROSS-REFERENCE TO RELATED APPLICATIONS

This application claims the benefit of U.S. Provisional Application Ser. No. 62/067,526, filed Oct. 23, 2014, and U.S. Provisional Application Ser. No. 61/940,895, filed Feb. 18, 2014, which is incorporated by reference herein in its entirety.

TECHNICAL FIELD

The present principles relate generally to electronic devices and, more particularly, to electronic devices having metal shields in the vicinity of a printed circuit board.

BACKGROUND

The market preference for set top boxes and the like (such as computers, game consoles, DVD players, CD players, etc.) is to have such devices be small, compact, and versatile. However, such preferences increasingly challenge the designers, because set top boxes and the like are required to perform more functions, which require more internal components. This results in more challenges to appropriately manage the heat generated by some of these components in these crowded devices, which is potentially detrimental to the device's longevity and performance. This crowding also results in more challenges to appropriately shield some components from the risk of electrostatic discharge and/or from interference (such as from radiofrequency interference) to and from other components and external sources.

To appropriately guard at-risk components, the common closed polygon vertical wall metal structures (i.e. shields) have been employed, which are secured generally to a printed circuit board. However, the devices that employ such shields tend to be items that are mass produced. As such, the shields in high volume production environments require rapid processing that requires the need for inspection of the mounted components contained within the shields. Thus, the shields and shield covers must be applied in these high volume production environments in a fast and reliable manner and the shield covers need to be easily removable for inspection and possible reworking of components contained therein.

FIG. 1 and FIG. 2 show an electronic device 1 and single height shield assembly 50 within the electronic device 1, respectively, to which the current principles are applicable. FIG. 1 more specifically shows the electronic device having a front wall 2, rear wall 3, top 4, and side walls 6. The electronic device 1 can be a set top box or the like (such as computers, game consoles, DVD players, CD players, etc.) that further includes a panel jack 5 for connecting cables 9, wherein one of the electrical connectors can be an F-connector 12 or the like. This view with the plurality of cables 9 connected to the electrical connectors on the panel jack 5 is indicative of how crowded the components within the electronic device 1 can be. As such, electronic devices 1 which can have a tuner or the like will require the shield assembly. In this view, one of the electrical connectors on the panel jack 5 can be an F-connector 12 or some other connector 13 that can be connected to some internal component requiring shielding.

In crowded devices, the F-connectors are required to be located in close proximity to other components on the printed circuit board and each of these components themselves can require shielding. However, the shielding requirements for the different components can be uniquely different. In such cases, some have employed multiple shields. While others have employed a shield assembly 50 such as that shown in FIG. 2 in which the height of the entire shield assembly, which can be a tuner shield assembly, is made at one large or full height in an effort appropriately shield all of the vulnerable components contained therein. Here, the use of F-connectors 12 often dictates the height of the shielding for all of the components in the region. This view shows that the shield assembly 50 includes a shield 51 having vertical walls and a shield cover 63 that covers the components captured within each of the shield rooms made by the vertical walls. In fact, the high vertical walls have been found to be quite beneficial to their intended shielding purpose. FIG. 2 further shows spring tabs or attachment springs 62 of the shield cover 63 that engage ridges or indents 64 on the vertical walls of the shield 51.

FIG. 3B shows a plan front view of previous spring tabs or attachment springs 62 of the shield cover 63 and FIG. 3A shows a cross section view of the spring tabs or attachment springs 62 cut along slice A-A in FIG. 3B. The spring tabs or attachment springs 62 can have edges 35 that bend inward and then outward as they extend from the top cover to create grasping portion 37 which extend over ribs or indents 64 in the vertical peripheral walls to secure the top cover to the shield. The spring tabs or attachment springs 62 can be flexible and the design of the spring tabs or attachment springs 62 can be such that a gap 69 exists between the interior upper vertical portion of the spring tabs or attachment springs 62 and the corresponding exterior upper vertical portion of the shield wall. Such a gap 69 can be advantageous in that it provides some manufacturing tolerance for cover formation and it permits the cover 63 to be placed on and removed from the shield 51 without the need for significant force.

FIG. 4B shows a plan front view of another previous spring tabs or attachment springs 62 of the shield cover 63 and FIG. 4A shows a cross section view of the spring tabs or attachment springs 62 cut along slice A-A in FIG. 4B. In this design, a gasket or extra shielding 61 is placed in the gap 69 to prevent possible radiofrequency (RF) interference around the gap 69 shown in FIG. 3A. However, it has been recognized that gaskets or extra shield material adds cost and makes the shield cover 63 more difficult to apply and remove.

It should be noted that radiofrequency shielding for many devices must meet mandatory emission specifications during testing. In fact, it has been the case that at times when a shield cover/lid does not meet electromagnetic interference emission specifications, the failure causes the designer to engineer to make changes in the design of the shield and/or develop and employ additional parts such as a gasket in order to have the shield pass tests that show conformance with emission specifications. Unfortunately, as mentioned above, adding extra material such as a gasket can make the application and removal of a shield cover difficult because there is extra friction and more contact area. However, if the cover/lid is designed to not have a tight fit by designing an oversized gasket or other part, there can be direct path for electromagnetic interference (EMI). Additionally, it follows that awareness of the possibility of such gaps can cause the manufacturer to apply greater force in the application of the shield cover than desirable, thereby providing the possibility of damaging the shield, the printed circuit board which supports the shield and components in the vicinity. Additionally, to resolve this gap issue in the past, designers have at times adjusted the spring tabs to ensure tight fit.

In light of the above mentioned shortcomings of the previous RF shield assemblies 50, a need exists for a new RF shielding assembly that provides for superior RF shielding and yet permits the shield cover to be applied and removed easily.

SUMMARY OF THE PRESENT PRINCIPLES

A set top box is disclosed that includes a vertical chassis wall having an aperture; a horizontal circuit board that extends toward the vertical chassis wall; an F-connector connected to the horizontal circuit board (either under or over the board) and extending out of the a vertical chassis wall through the aperture; and inner shield (which can generally be used to contain/shield the RF circuit components mounted on the circuit board), wherein the inner shield comprises ribs or indents on the vertical peripheral walls; and a shield cover comprises spring tabs or attachment springs extending downward from a peripheral edge of a top portion of the shield cover in which the spring follows the contour of the top vertical edge region of the vertical peripheral walls and is configured to have a minimal gap such that the cover is not tight and yet does not provide a direct path for electromagnetic interference.

In an embodiment, an electronic device such as a set top box is provided that includes an outer casing, a horizontal printed circuit board within the outer casing, a radiofrequency shield on the printed circuit board that surrounds an interior part of an electronic component or an electronic component in which the radiofrequency shield has upstanding walls in which the upstanding walls have ridges or indents, a shield cover on the radiofrequency shield in which the shield cover has a top portion and side portions, which can be rigid, that extend downward from the top portion. The side portions can be parallel to the upstanding walls and the attachment springs can extend from the side portions in which the attachment springs has an upper bend part that extends outward from the side portion to a peak and a middle bend part that extends inward from the peak to a contact part. The contact part engages the ridges or indents to secure the shield cover to the radiofrequency shield. The side portions are closer to the upstanding walls than a thickness of the side portions and/or the side portions contacting the upstanding walls or being closer to the upstanding walls than a depth of the ridges or a horizontal protrusion dimension of the ridges.

BRIEF DESCRIPTION OF THE DRAWINGS

The present principles may be better understood in accordance with the following exemplary figures, in which.

DETAILED DESCRIPTION

The invention will now be described in greater detail in which embodiments of the present principles are illustrated in the accompanying drawings.

Figure 1:
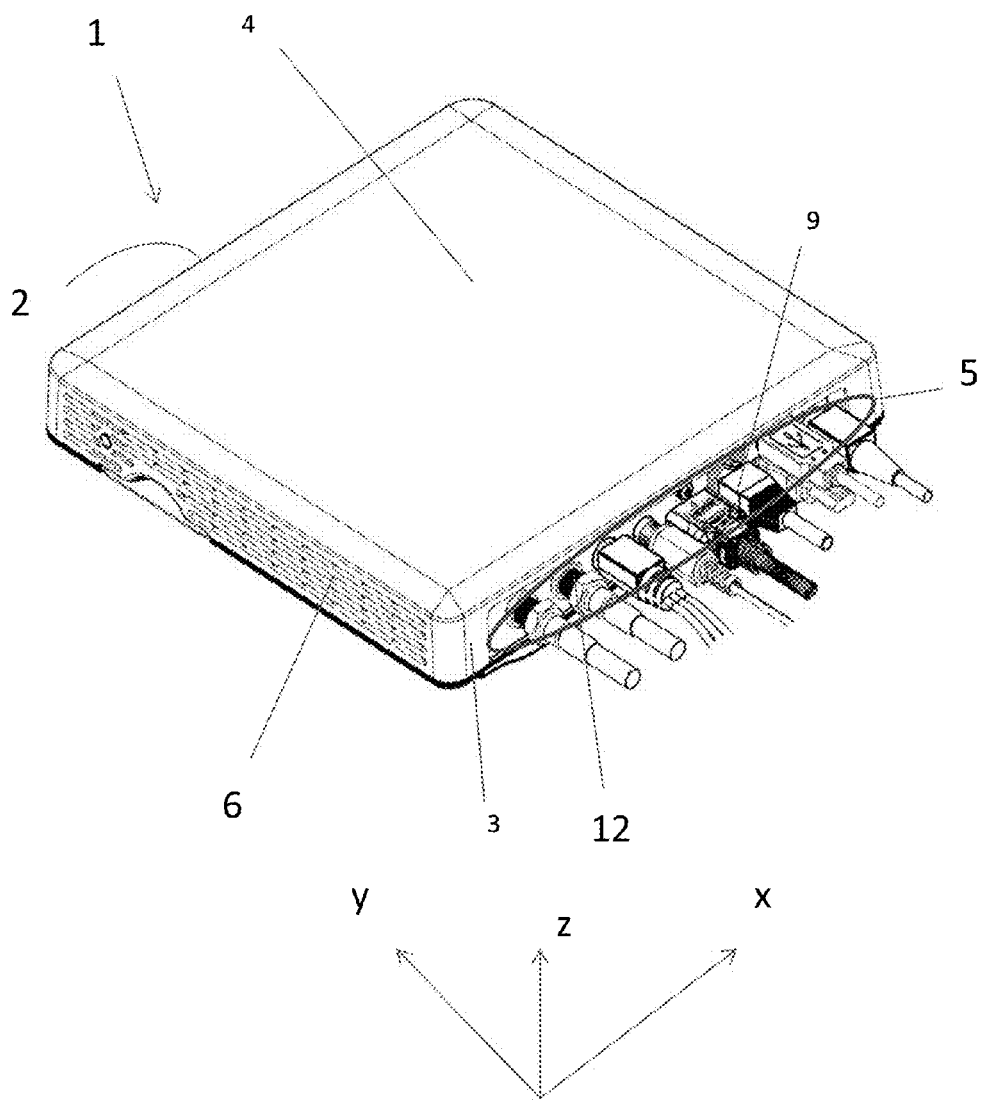
FIG. 1 shows a perspective rear view of an electronic device that employs a tuner shield to which the current principles are applicable.

FIG. 1 shows an electronic device 1 having a front wall 2, rear wall 3, top 4, and side walls 6 in which the shield assembly 50 according to the present principles is applicable. The electronic device 1 can be a set top box or the like (such as computers, game consoles, DVD players, CD players, etc.) that further includes a panel jack 5 for connecting cables 9, wherein one of the electrical connectors can be an F-connector 12 or the like. This view with the plurality of cables 9 connected to the electrical connectors on the panel jack 5 is indicative of how crowded the components within the electronic device 1 can be. As such, such electronic devices 1 which can have a tuner or the like will require a tuner shield. In this view, one of the electrical connectors on the panel jack 5 can be an F-connector 12 and/or some other connector that can be connected to some internal component requiring shielding.

Figure 5:
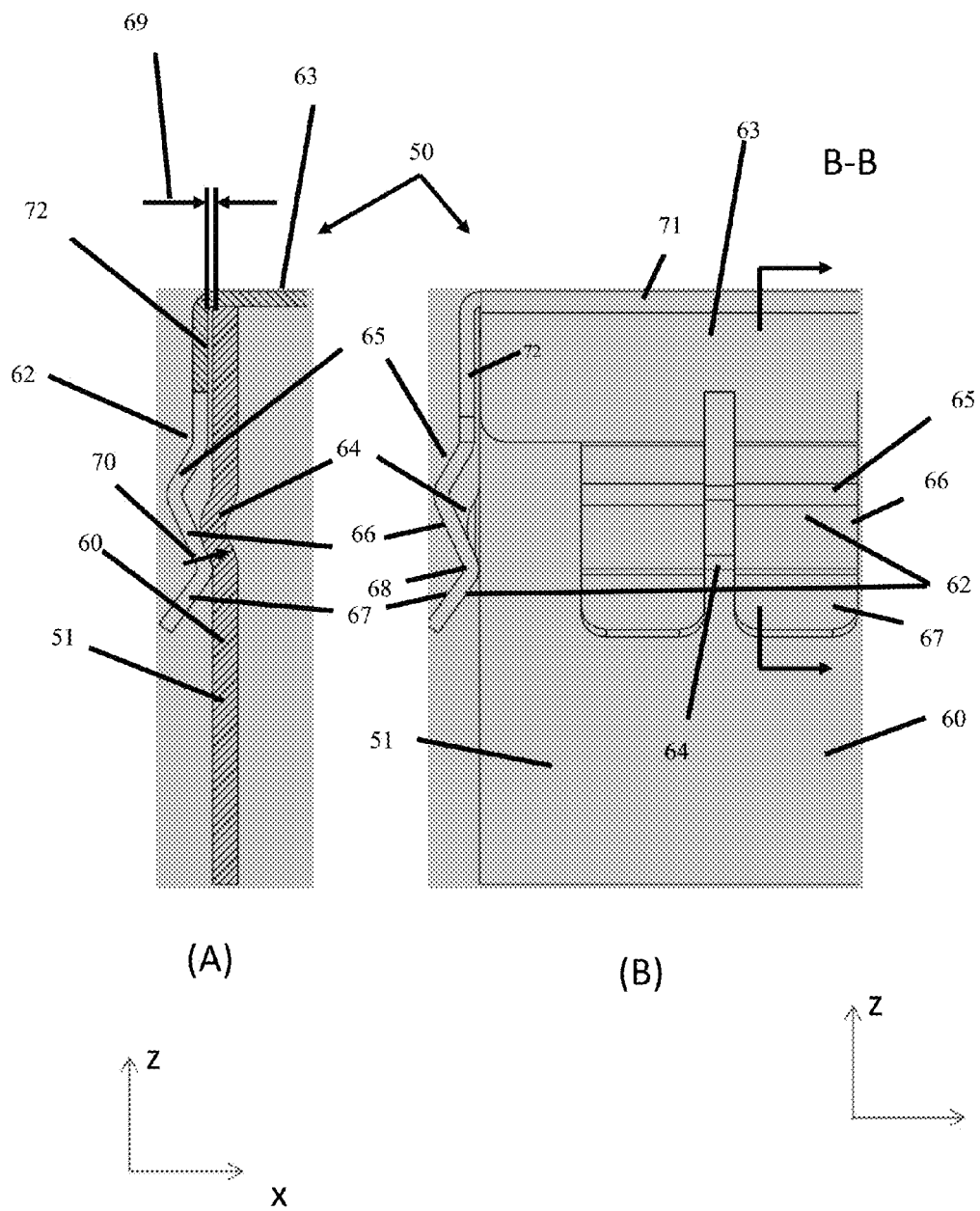
FIGS. 5a and 5b show views of a shield cover applied to a shield according to the present principles.

FIG. 5B shows a plan front view of spring tabs or attachment springs 62 of the shield cover 63 and FIG. 5A shows a cross section view of the spring tabs or attachment springs 62 cut along slice B-B in FIG. 5B according to the present principles. The views in FIGS. 5a and 5b can be applicable to any or all of the shield walls 60 of the shield assembly shown in FIG. 2.

It should be noted that some of the features of the components of the shield assembly 50 will have the same names and reference signs to those in the known assemblies in FIGS. 3a, 3b, 4a and 4b. In particular, the sizing and contouring of the shield cover 63 of the current principles are such that the seal is extremely efficient in preventing leaks by reducing the amount of open spaces of the enclosure.

Additionally, it should be noted that FIGS. 5a and 5b can be also viewed as showing three separate spring tabs 62: two of the tabs 62 are generally parallel and are positioned on one shield wall 60 as shown in FIG. 5B and the third is generally perpendicular to the first two tabs 62 and this third tab is positioned on another shield wall 60 that is perpendicular to the first shield wall 60 as shown in FIG. 5A; however, it should be understood that the x-axis in FIG. 5A would change to the y-axis for this specific arrangement of viewing three separate tabs 62.

As can be observed from the view in FIG. 5A, there is an overlap of a side portion 72 of the interior surface of the shield cover 63 as it is positioned around the exterior vertical edge of the shield wall 60. This arrangement in FIG. 5A further shows how spring tab 62 of the shield cover 63 provides a spring force 70 to secure the shield cover 63 to the shield wall 60 of the shield 51. The shield cover 63 comprises a top portion that runs along or extends over the horizontal x-y plane and side portions 72 that extend from the periphery of the top portion and downward along the vertical z axis to overlap a part of the shield wall 60. The spring tabs 62 can extend from the side portion and can comprise an upper bend part 65 part that extends outward which can be an acute angle or have an average acute angle if the part is curved with the shield wall 60. The tabs 62 can then bend inward from a peak to form a middle bend part 66 which can be an acute angle or have an average acute angle if the part is curved with the shield wall 60. The tabs 62 can further then bend outward from a contact part 68 to form a lower bend part 67 which can be an acute angle or have an average acute angle if the part is curved with the shield wall 60. A ridge 64 can be protrude inward or outward from the shield wall 60. The ridge engages the contact part 68 to secure the shield cover to the inner shield. Alternatively, the ridge can be or be replaced by an opening to accept the contact part.

The shield assembly 50 in FIGS. 5a and 5b without the extra shield piece or gasket is as effective as that those assemblies with the extra gasket like material or extra shield piece 61.

Figure 6:
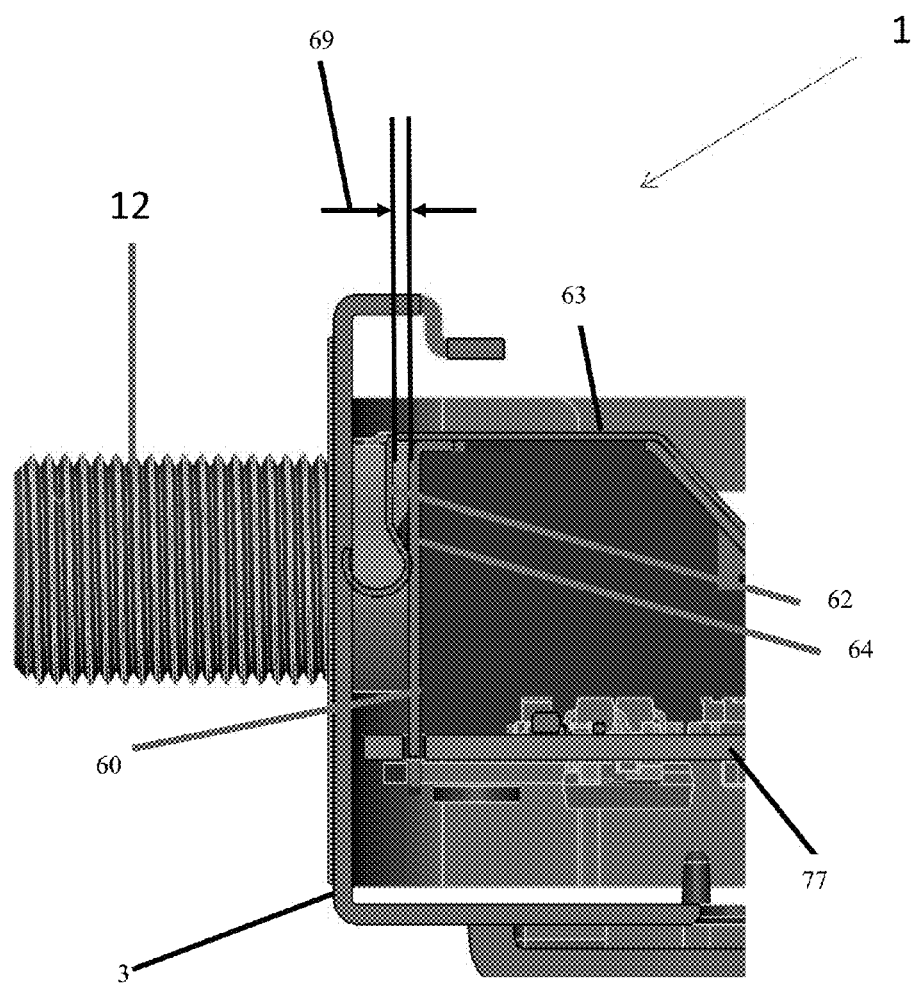
FIG. 6 shows a sectional view of the previous attachment spring of the shield cover applied to a shield in the vicinity of an F-connector.
Figure 7:
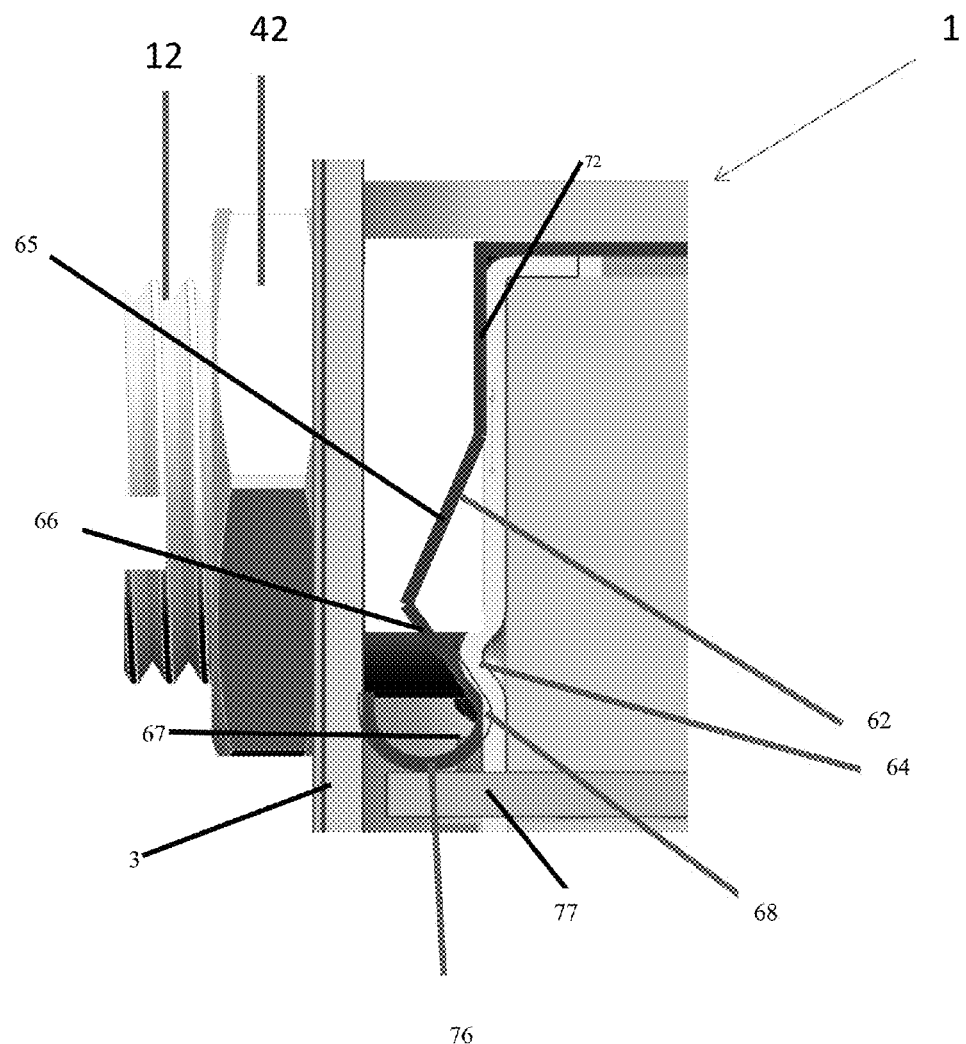
FIG. 7 shows a sectional view of the attachment spring of the shield cover applied to a shield in the vicinity of an F-connector according to the present principles.

FIGS. 6 and 7 shows a sectional view of the previous attachment spring and the attachment spring of the shield cover according to an embodiment of the present principles, respectively, applied to a shield in the vicinity of an F-connector. If an F-connector is used, the previous design shown in FIG. 6 has the spring tab 62 in the vicinity of the standard height (i.e. 5 mm) swaged F-connector which can have a nut contacting the rear wall 3 of the electronic device 1 well above the printed circuit board 77 and around the midsection region of the F-connector in which a gap exists between the spring and the wall at the top of the wall. In contrast, FIG. 7 shows that there is not substantial gap or a minimal gap according to the present principles and this figure shows that the spring tab 62 can be elongated in the vicinity of the F-connector such that end of the spring 62 contacts the printed circuit board 77 or a ground contact on the printed circuit board and/or contact the rear wall at or below the horizontal cylindrical part of the F-connector.

The tabs 62 in FIG. 7 can further extend from the side portion 72 and can comprise an upper bend part 65 that extends outward which can be an acute angle or have an average acute angle if the part is curved with the shield wall 60. The tabs 62 can then bend inward from a peak to form a middle bend part 66 which can be an acute angle or have an average acute angle if the part is curved with the shield wall 60. The tabs 62 can further then bend outward from a contact part 68 to form a lower bend part 67 which can be an acute angle or have an average acute angle if the part is curved with the shield wall 60. From the lower bend part 67, the tabs 62 can curl to form a distal or curved end 76 that can be convex with respect to the printed circuit board 77. The distal or curved end 76 can contact the printed circuit board at its bottom and/or contact the rear wall 3 at or near its ultimate end. The curved feature of the end 76 permits the shield cover to slide unto and off of the shield with the shield already affixed on the printed circuit board 3 and in the chassis of the electronic device 1. The ridge 64 can protrude inward or outward from the shield wall 60. The ridge engages the contact part 68 to secure the shield cover to the inner shield. Alternatively, the ridge can be or be replaced by an opening to accept the contact part.

The present principle can employ non-swaged F-connectors; however, these non-swaged F-connectors were found to not shield as well as the swaged connector.

Figure 2:
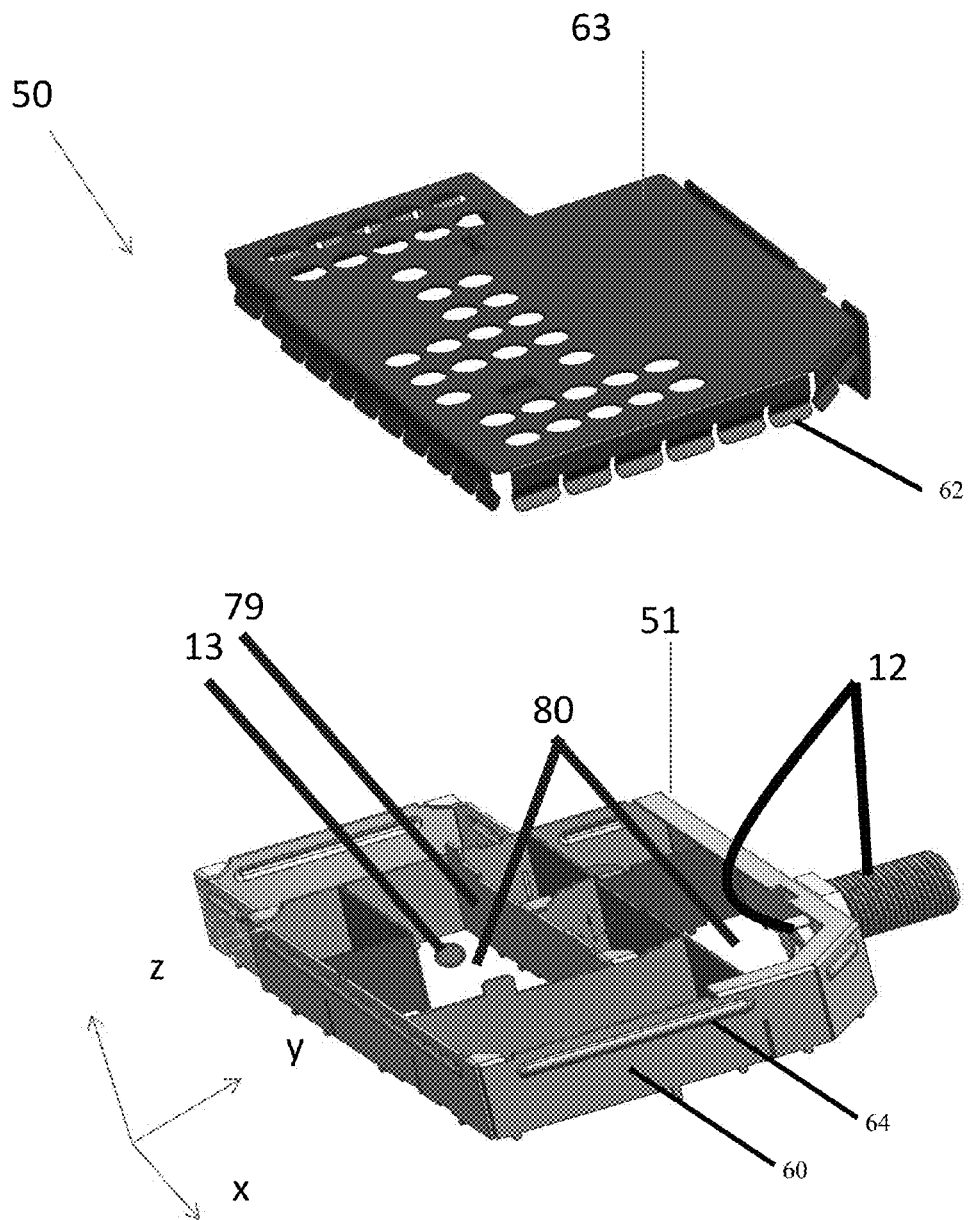
FIG. 2 shows a perspective disassembled view of a tuner shield assembly to which the current principles are applicable.
Figure 3:
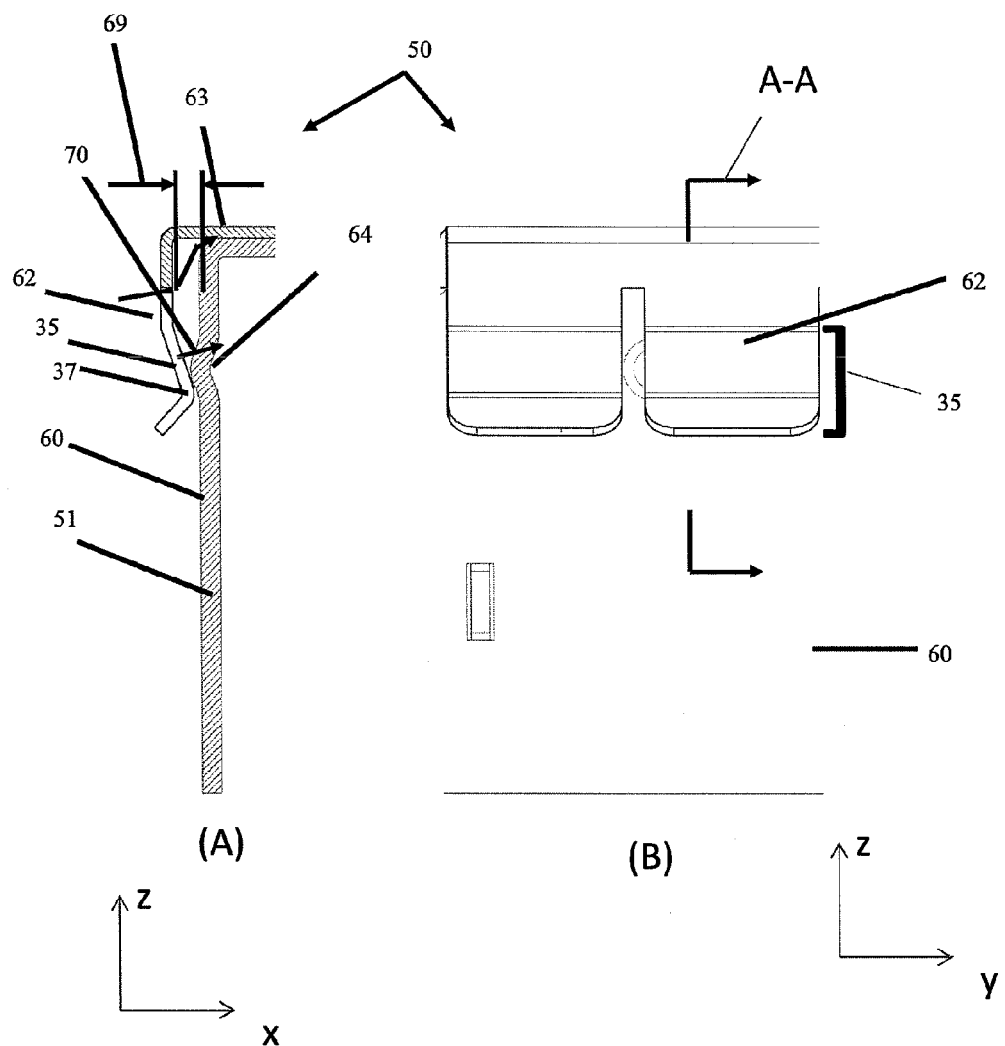
FIGS. 3a and 3b show views of a previous shield cover applied to a shield.
Figure 4:
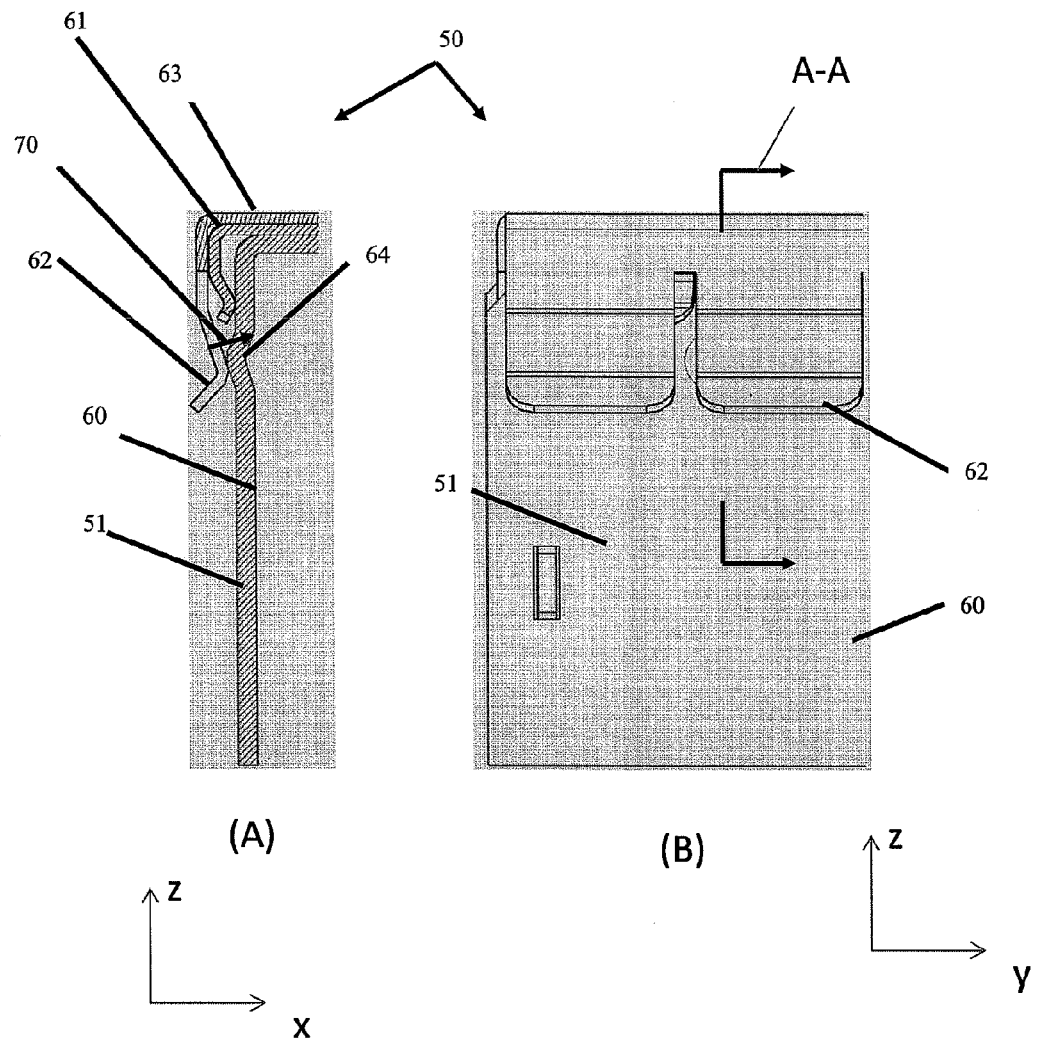
FIGS. 4a and 4b show views of another previous shield cover applied to a shield.
Figure 8:
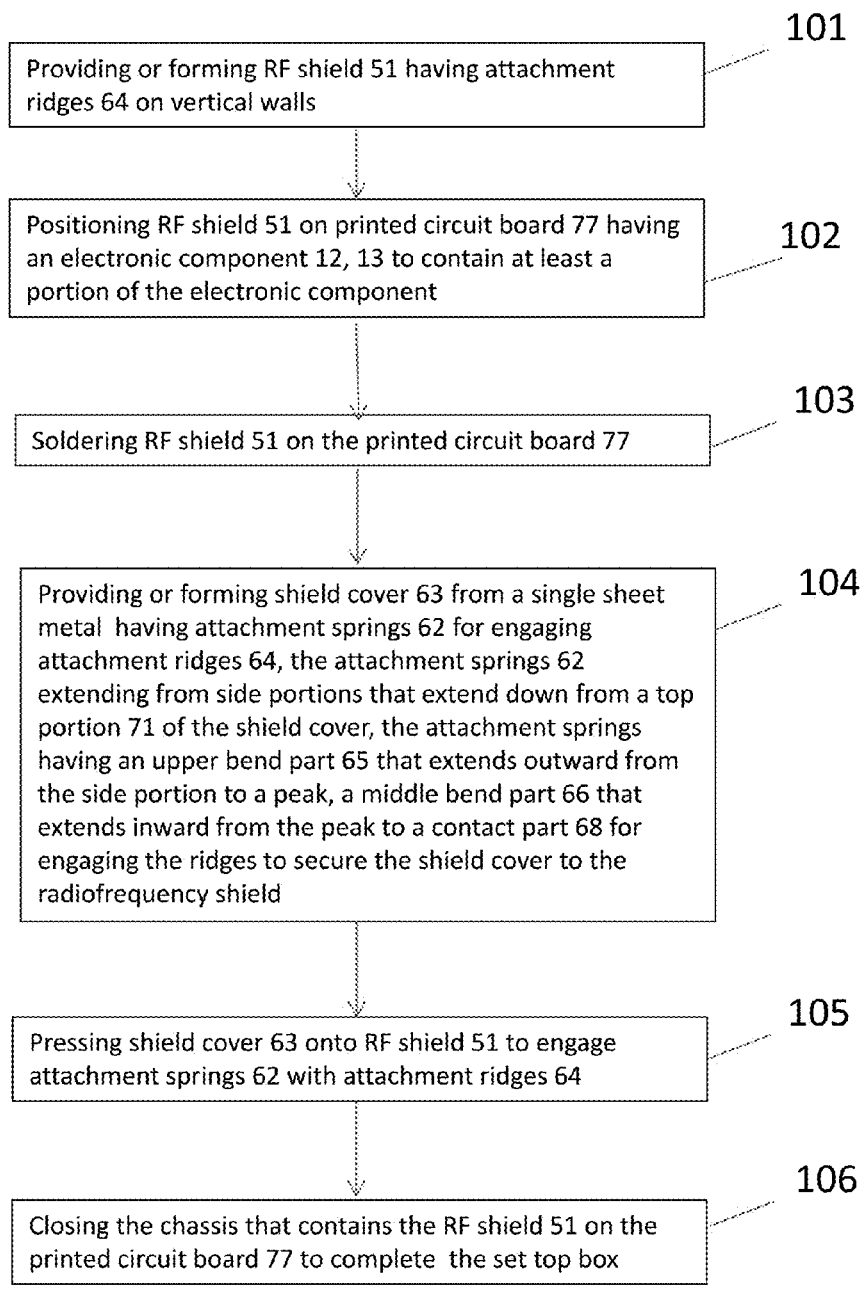
FIG. 8 is a flowchart for the method of forming the electronic device according to the current principles.

FIG. 8 is a flowchart for the method of forming the electronic device 1 according to the current principles. Step 101 involves providing or forming the RF shield 51 having attachment ridges 64 on vertical walls. In this step the attachment ridges 64 can be formed on vertical walls through stamping, for example, and a rooms 80 as shown in FIG. 2 can be formed by the appropriate folding of a metal sheet to form an outer periphery. Interior vertical walls 79 can be formed from the folding and/or inserted after the folding to create the various rooms which can provide shielding between different components contained within the shield 51. The folding can include making horizontal ledges at multiple corners in the rooms to enhance shielding in those areas. Step 102 involves positioning the RF shield 51 on printed circuit board (pcb) 77 having an electronic component or components 12, 13 to contain at least a portion of any of the electronic components. Here, the individual electronic components on the circuit board can be contained within the individual rooms by the positioning. Step 103 involves attaching the shield 51 to the printed circuit board 77 by, for example, soldering. Step 104 involves providing or forming the shield cover 63 from a single sheet metal having attachment springs 62 for engaging attachment ridges 64. The attachment springs 62 can be stamped such that they extending from side portions that extend down from a top portion 71 of the shield cover and such that they have an upper bend part 65 that extends outward from the side portion to a peak, a middle bend part 66 that extends inward from the peak to a contact part 68 for engaging the ridges to secure the shield cover to the radiofrequency shield. The attachment springs 62 can collectively extend and/or cover in the horizontal dimensions more than 75% of the periphery of the shield. The shield cover can contact the top edges of the each of the rooms for effective shielding in which this contact can be complete along the entire periphery of each room. Step 106 involves closing a chassis that contains the RF shield 51 on the printed circuit board 71 with the F-connector and/or other electronic components 12, 13, which can involve attaching a top 4 on the chassis.

Although the illustrative embodiments have been described herein with reference to the accompanying drawings, it is to be understood that the present principles are not limited to those precise embodiments, and that various changes and modifications may be effected therein by one of ordinary skill in the pertinent art without departing from the scope of the present principles. All such changes and modifications are intended to be included within the scope of the present principles as set forth in the appended claims.

Also, it should be noted that expressions such as "vertical," "horizontal," "front," "back," "top," bottom," "upper," "lower" and "over" are used in the description and claims with regards to certain elements with respect of an arbitrary coordinate system such as that shown in some figures; however, the invention is intended for use in components and/or the electronic devices that may be rotated 90 degrees, 180 degrees or to some other value either about a vertical reference line or a horizontal reference lines. This implies that "horizontal" can mean "vertical" and vice versa, "top" can mean "bottom" and vice versa, etc.

The invention claimed is:

1. An electronic device comprising:
an outer casing;
a printed circuit board within the outer casing;
a radiofrequency shield on the printed circuit board that surrounds an interior part of an electronic component or that surrounds the electronic component, the radiofrequency shield having walls, in which the walls have ridges or indents;
a shield cover disposed on the radiofrequency shield, the shield cover having a top portion and side portions that extend downward from the top portion, the side portions being parallel to the walls; and
for at least one side portion of the side portions, at least one attachment spring extending from the at least one side portion, the at least one attachment spring having an upper bend part that extends outward from the at least one side portion to a peak and a middle bend part that extends inward from the peak to a contact part, the contact part engaging the ridges or indents to secure the shield cover to the radiofrequency shield.

2. The electronic device of claim 1 wherein the side portions are at a distance to the walls less than a thickness of the side portions.

3. The electronic device of claim 1 further comprising at least one interior wall that forms interior closed rooms with at least one other interior wall or at least one of the walls.

4. The electronic device of claim 2 wherein the interior part of an electronic component or the electronic component is an F-connector.

5. The electronic device of claim 4 wherein:
one of the walls is a back wall of the radiofrequency shield and is parallel to a chassis rear wall of the outer casing; and
the F-connector extends from within the radiofrequency shield through the back wall of the radiofrequency shield and through the chassis rear wall.

6. The electronic device of claim 5 wherein the at least one attachment spring is positioned adjacent the F-connector along the back wall and extends down to and contacts a ground on the printed circuit board.

7. The electronic device of claim 5 wherein the at least one attachment spring is positioned adjacent the F-connector along the back wall and has distal ends that contact the chassis rear wall.

8. The electronic device of claim 5 wherein the at least one attachment spring is positioned adjacent the F-connector along the back wall and extends down to distal ends past the contact part, the distal ends contacting a ground on the printed circuit board and the chassis rear wall.

9. The electronic device of claim 7 wherein the at least one attachment spring extends down further than another at least one attachment spring positioned along another of the walls.

10. An electronic device comprising:
a chassis wall having an aperture;
a circuit board that extends toward the chassis wall;
an F-connector connected to the circuit board and extending out of the chassis wall through the aperture;
an inner shield mounted on the circuit board on an interior side of the chassis wall and connected to the F-connector, wherein the inner shield comprises a series of peripheral walls and the series of peripheral walls have ridges;
a shield cover that covers the inner shield, wherein the shield cover comprises a top portion and side portions that extend from a periphery of the top portion and downward along the series of peripheral walls, the side portions contacting the peripheral walls or being at a distance to the peripheral walls less than a depth or a dimension protrusion of the ridges; and
attachment springs extending from the side portions, the attachment springs having an upper bend part that extends outward from the side portion to a peak, a middle bend part that extends inward from the peak to a contact part, the contact part engaging the ridges to secure the shield cover to the inner shield.

11. The electronic device of claim 10 wherein the attachment springs are positioned adjacent the F-connector along one of the peripheral walls and extend down to and contact a ground on the circuit board.

12. The electronic device of claim 10 wherein the attachment springs are positioned adjacent the F-connector along one of the peripheral walls and have distal ends that contact the chassis wall.

13. The electronic device of claim 10 wherein the attachment springs are positioned adjacent the F-connector along one of the peripheral walls and extend down to distal ends past the contact part, the distal ends contacting a ground on the circuit board and the chassis wall.

14. The electronic device of claim 13 wherein the attachment springs are positioned adjacent the F-connector and extend down further than the attachment springs positioned along others of the peripheral walls.

15. The electronic device of claim 10 wherein one attachment spring of the attachment springs is positioned adjacent the F-connector along one of the peripheral walls and extends down to a curved distal end past the contact part, the curved distal end having a convex side contacting a ground on the printed circuit board and the chassis wall.

16. The electronic device of claim 15 wherein the one attachment spring extends down further than the attachment springs positioned along others of the peripheral walls.

17. The electronic device of claim 10 wherein one attachment spring of the attachment springs is positioned adjacent the F-connector along one of the peripheral walls and extends down to a curved distal end past the contact part; and
the ridge to which the attachment spring is positioned adjacent the F-connector engages is positioned closer to the circuit board than the top portion.

18. The electronic device of claim 10 wherein one attachment spring of the attachment springs is positioned adjacent the F-connector along one of the peripheral walls and extends down to a distal end past the contact part; and
the ridge to which the attachment spring is positioned adjacent the F-connector engages is positioned closer to the circuit board than the top portion and the ridges on others of the peripheral walls are closer to the top portion than the printed circuit board.

19. A method of constructing a electronic device comprising the steps of:
providing or forming a tuner shield in which the tuner shield has exterior walls and attachment ridges on the exterior walls;
positioning the tuner shield on a printed circuit board having at least one first electronic component and at least one second electronic component such that the at least one first electronic component is contained in the tuner shield;
attaching the tuner shield to the printed circuit board;
providing or forming a shield cover having attachment springs for engaging to the attachment ridges, the shield cover having a top portion from which side portions extend downward, the attachment springs extend down from side portions, the attachment springs having an upper bend part that extends outward from the side portion to a peak, a middle bend part that extends inward from the peak to a contact part for engaging the attachment ridges to secure the shield cover to the radiofrequency shield;
pressing the shield cover onto the tuner shield to engage the attachment springs with the attachment ridges; and
closing a chassis that contains the tuner shield on the printed circuit board.

* * * * *